United States Patent
Denham

(10) Patent No.: US 8,890,052 B2
(45) Date of Patent: Nov. 18, 2014

(54) SHIFT REGISTER WITH TWO-PHASE NON-OVERLAPPING CLOCKS

(75) Inventor: Martin S. Denham, Bend, OR (US)

(73) Assignee: Raytheon Company, Waltham, MA (US)

( * ) Notice: Subject to any disclaimer, the term of this patent is extended or adjusted under 35 U.S.C. 154(b) by 341 days.

(21) Appl. No.: 13/401,517

(22) Filed: Feb. 21, 2012

(65) Prior Publication Data

US 2014/0061442 A1 Mar. 6, 2014

Related U.S. Application Data

(60) Provisional application No. 61/481,968, filed on May 3, 2011.

(51) Int. Cl.
| | |
|---|---|
| *H03K 17/78* | (2006.01) |
| *G11C 19/00* | (2006.01) |
| *H04N 5/3745* | (2011.01) |
| *H04N 5/355* | (2011.01) |
| *H04N 5/335* | (2011.01) |

(52) U.S. Cl.
CPC ............ *G11C 19/00* (2013.01); *H04N 5/37455* (2013.01); *H04N 5/355* (2013.01); *H04N 5/335* (2013.01)
USPC ................. 250/214 DC; 250/208.2; 348/283; 348/319

(58) Field of Classification Search
CPC ...... G06F 7/584; G11C 29/20; H04N 3/1575; H04N 5/37206; H04N 5/37213; H04N 5/3742
USPC ................. 250/214.1, 214 R, 214 DC, 208.2; 348/283, 316, 319, 321, 323, E3.022
See application file for complete search history.

(56) References Cited

U.S. PATENT DOCUMENTS

| | | | |
|---|---|---|---|
| 5,461,425 | A | 10/1995 | Fowler et al. |
| 7,463,278 | B2 | 12/2008 | Ozasa et al. |
| 7,505,022 | B2 | 3/2009 | Matsuda et al. |
| 7,895,492 | B2 | 2/2011 | Hiraide et al. |
| 7,940,317 | B2 | 5/2011 | Baxter |
| 2003/0058360 | A1 | 3/2003 | Liu et al. |
| 2007/0158533 | A1 | 7/2007 | Bamji et al. |
| 2009/0002535 | A1 | 1/2009 | Park et al. |

(Continued)

FOREIGN PATENT DOCUMENTS

| | | |
|---|---|---|
| EP | 1858245 A1 | 11/2007 |
| WO | 2006113414 A2 | 10/2006 |

OTHER PUBLICATIONS

Fischer, Peter et al. "Multi-Channel Readout ASIC for ToF-PET", Nuclear Science Sumposium Conference Record, IEEE, 2006.

*Primary Examiner* — Francis M Legasse, Jr.
(74) *Attorney, Agent, or Firm* — Lando & Anastasi, LLP

(57) ABSTRACT

According to one embodiment, a method includes generating a first clock signal and a second clock signal with non-overlapping clock phases. The method may further include latching, by a plurality of master latches of a shift register, a plurality of values at a plurality of inputs of the master latches in response to a particular type of logical transition of the first clock signal. The method also includes latching, by a plurality of slave latches of the shift register, a plurality of output values of the plurality of master latches at a plurality of inputs of the slave latches in response to a particular type of logical transition of the second clock signal.

16 Claims, 4 Drawing Sheets

(56) References Cited

U.S. PATENT DOCUMENTS

| | | | |
|---|---|---|---|
| 2009/0027533 A1* | 1/2009 | Itakura et al. | 348/308 |
| 2009/0244346 A1 | 10/2009 | Funaki | |
| 2010/0181464 A1 | 7/2010 | Veeder | |
| 2010/0194956 A1 | 8/2010 | Yuan et al. | |
| 2012/0280110 A1 | 11/2012 | Denham | |

* cited by examiner

# US 8,890,052 B2

SHIFT REGISTER WITH TWO-PHASE NON-OVERLAPPING CLOCKS

RELATED APPLICATION

This application claims benefit under 35 U.S.C. §119(e) of U.S. Provisional Application Ser. No. 61/481,968, entitled "DIGITAL PIXEL ACCUMULATOR CIRCUIT," filed May 3, 2011.

GOVERNMENT FUNDING

The U.S. Government may have certain rights in this invention as provided for by the terms of Contract No. HR0011-08-C-0115 awarded by the Department of Defense.

TECHNICAL FIELD

The present disclosure relates generally to focal plane arrays and more specifically to a shift register with two-phase non-overlapping clocks.

BACKGROUND

A focal plane array may comprise a plurality of digital pixels used to create an image. Each digital pixel may include a photo-detector for converting light to electrical charge. This charge may be stored in a well capacitor. The well capacitor may be reset (i.e., the charge of the capacitor may be completely dissipated or dissipated by a predetermined amount) each time its charge exceeds a threshold value. The number of times that a capacitor is reset corresponds to the amount of light received by the digital pixel. An image may be constructed according to the amount of light received by each digital pixel of the focal plane array.

SUMMARY OF THE DISCLOSURE

According to one embodiment of the present disclosure, a method includes generating a first clock signal and a second clock signal with non-overlapping clock phases. The method may further include latching, by a plurality of master latches of a shift register, a plurality of values at a plurality of inputs of the master latches in response to a particular type of logical transition of the first clock signal. The method also includes latching, by a plurality of slave latches of the shift register, a plurality of output values of the plurality of master latches at a plurality of inputs of the slave latches in response to a particular type of logical transition of the second clock signal.

Certain embodiments of the disclosure may provide one or more technical advantages. A technical advantage of one embodiment may be that hold time issues may be avoided by clocking a shift register with clock signals that have non-overlapping phases. Another technical advantage of one embodiment may be that hold time issues may be avoided without placing delay elements in between master latches and slave latches of a shift register.

Certain embodiments of the disclosure may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION OF THE DRAWINGS

Figure 1:
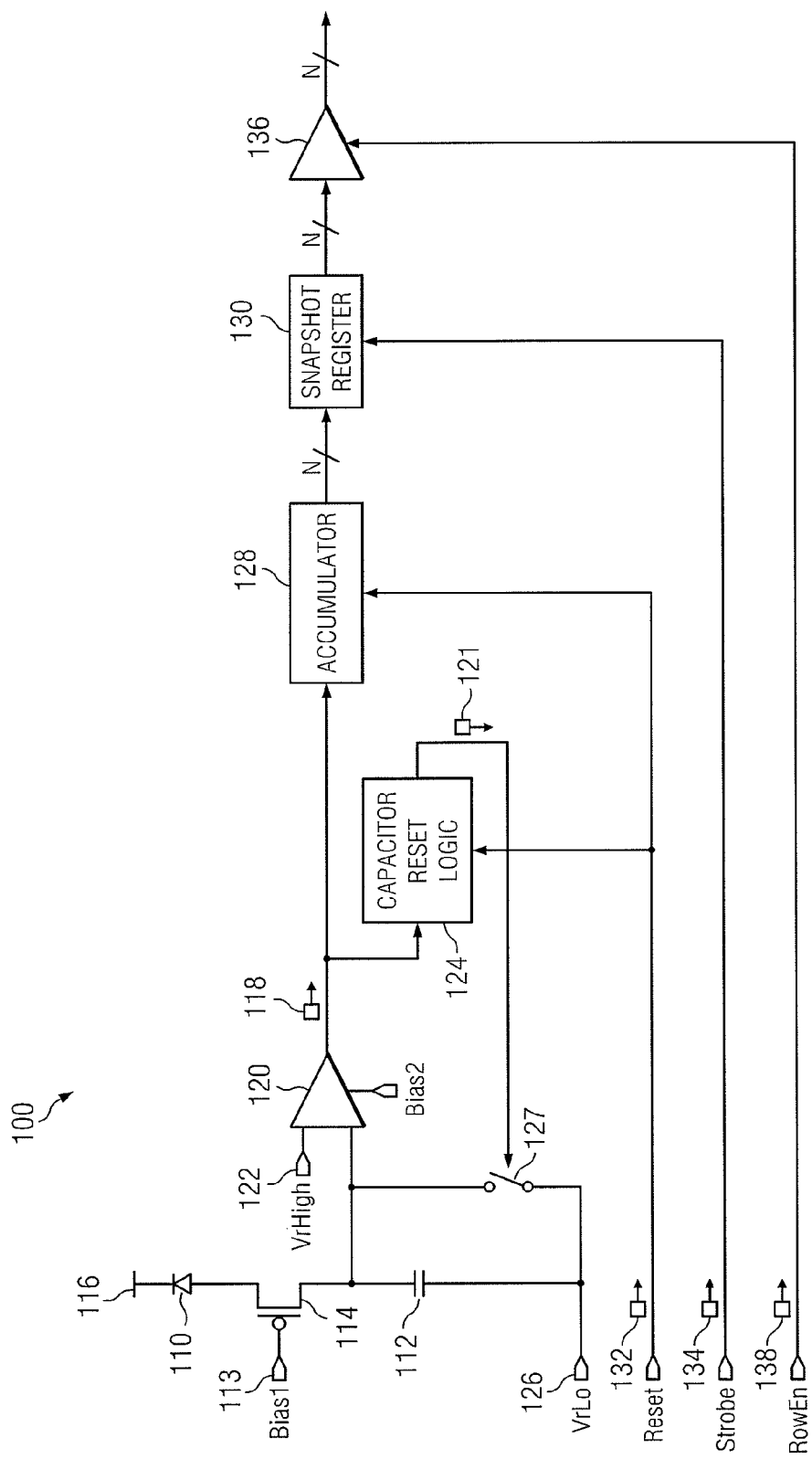
FIG. 1 depicts an example digital pixel comprising an example accumulator, an example snapshot register, and an example tri-state gate.

FIG. 1 depicts an example digital pixel 100 of a focal plane array (FPA). An FPA may comprise a plurality of digital pixels 100. Digital pixel 100 includes one or more well capacitors 112 configured to collect charge corresponding to an amount of light received at the respective digital pixel 100. Digital pixel 100 may further include an accumulator 128 operable to store a value corresponding to an amount of charge collected by the one or more well capacitors 112 of digital pixel 100.

In general, an FPA may comprise a plurality of pixels used to create an image. A pixel is an area of an FPA that includes circuitry for detecting an amount of light received. Each pixel of the FPA may include a photo-detector (such as a photo-diode) for converting light to electrical charge. This charge may be stored in a well capacitor. The well capacitor is generally included within the pixel along with the photo-diode. However, the pixel size of a read out integrated circuit (ROIC) FPA is generally constrained by the pitch of the photo-diodes of the FPA and is relatively small. For example, if the photo-diodes of a Long-Wave Infrared (LWIR) FPA are on a 30 micrometer pitch, then the pixel size is generally no larger than 30 micrometers per side. Because of these size constraints, a well capacitor that fits within a pixel may not be large enough to hold all of the photo-current generated by the photo-diode of the pixel. Accordingly, a pixel may reset its well capacitor (i.e., dissipate the charge of the well capacitor completely or by a predetermined amount) when its collected charge exceeds a threshold value so that the well capacitor can continue to collect charge. The number of times that a well capacitor is reset over a time interval (such as a frame) corresponds to the amount of light received by the pixel. This number may be tracked by a counter that increments each time the well capacitor is reset.

The circuit that detects the threshold crossing of the well capacitor and counts the number of times that the well capacitor has been reset may be included in the pixel along with the photo-diode and capacitor. This implementation of the logic is called an "in-pixel analog to digital converter (ADC)" and the resulting pixel may be termed a "digital pixel." In typical configurations, a digital pixel includes an accumulator to track the number of times its well capacitor has filled up to a threshold with charge. In some situations, the accumulator may include a shift register (such as a linear feedback shift register (LFSR)) that implements a counter. The shift register may contain a plurality of master and slave latch pairs that each store a bit of the shift register. The master latches may be clocked by a signal and the slave latches may be clocked by the complement of that signal (e.g., an inverter may be placed in between the signal and the slave latches). In such configurations, one or more buffers may be placed between the master latch and slave latch of each bit of the shift register in order to protect against hold time violations. However, these buffers enlarge the area required for the circuitry of the pixel and raise the power consumption of the pixel.

Certain embodiments of the disclosure include an accumulator 128 with two-phase non-overlapping clock signals for opening and closing the latches of a shift register of the accumulator 128. One clock signal is used to open and close the master latches and the other clock signal is used to open and close the slave latches. Such embodiments provide a shift register with hold time violation immunity without requiring buffers between the master latches and slave latches of the shift register. By reducing the amount of circuitry included within the digital pixel 100, certain embodiments of the disclosure improve cost, performance, density, and/or power consumption of digital pixels for a given digital pixel size and process photo-lithography node. Although certain embodiments of the present disclosure are described herein using the shift register or accumulator 128 of digital pixel 100 as an example, the methods and structures described herein may be applicable to any shift register with master and slave latches.

Referring to FIG. 1, digital pixel 100 comprises a photo-diode 110 coupled to a voltage source 116 and a direct injection gate 114. Direct injection gate 114 may include any suitable biasing mechanism, such as a metal oxide semiconductor (MOS) transistor. Direct injection gate may be biased using bias 113. Digital pixel 100 also includes a well capacitor 112 configured to receive charge from photo-diode 110 through direct injection gate 114. In other embodiments, photo-diode 110 is coupled to well capacitor 112 using other suitable arrangements. Other embodiments may use other photo-diode schemes and/or other detection devices to generate and store charge indicative of detected light.

Well capacitor 112 may represent any suitable number of capacitors that form any suitable effective capacitance, such as one femto-farad (ff). In particular embodiments, the size and/or arrangement of the well capacitors 112 is adjustable such that the operation of the digital pixel 100 may be optimized. Digital pixel 100 may be operable to convert one or more particular wavelengths of light to electrical charge. As an example, the digital pixel 100 may be operable to receive long-wave infrared (LWIR), mid-wave infrared (MWIR), and/or other wavelengths of light and generate photo-current from the received light. Some wavelengths of light may generate more photo-current than others. Thus, the size of the well capacitors 112 may be adjusted according to the expected wavelength of light in order to optimize the operation of the digital pixel 100.

Well capacitor 112 may be reset to a reference voltage 126 by application of a reset signal 121 to switch 127. In other embodiments, application of the reset signal 121 to switch 127 results in reducing the charge in well capacitor 112 by a predetermined amount. Well capacitor 112 is also coupled to comparator 120 which is configured to transition a capacitor reset signal 118 when the voltage across well capacitor 112 crosses (e.g., exceeds) a reference voltage 122. In some embodiments, comparator 120 continuously compares the voltage across well capacitor 112 to a reference voltage. In other embodiments, comparator 120 only performs the comparison upon receiving a periodic strobe in order to optimize power usage.

Capacitor reset logic 124 receives capacitor reset signal 118 and reset signal 132 and generates reset signal 121 based on these two signals. In a particular embodiment, capacitor reset logic 124 includes a NAND gate with capacitor reset signal 118 and reset signal 132 as inputs and reset signal 121 as an output. Reset signal 121 may be transitioned in response to a detection of a transition of capacitor reset signal 118. As used herein, a transition of a signal may refer to any suitable event, such as a transition from a low voltage (logical "0") to a high voltage (logical "1") or a transition from a high voltage to a low voltage. Although certain actions are described herein as occurring in response to a particular type of transition (e.g., a rising edge of a signal), one or more of these actions may occur in response to any suitable type of signal transition (e.g., a falling edge of the signal).

Accumulator 128 may store a charge count value for digital pixel 100 that is indicative of an amount of charge received at well capacitor 112 (and thus the light received at digital pixel 100). For example, accumulator 128 may monitor capacitor reset signal 118 and track the number of times the capacitor reset signal 118 transitions from a high voltage to a low voltage (or vice versa). Snapshot register 130 is configured to receive the charge count value from the accumulator 128 and capture the charge count value upon a particular transition (such as a transition from a low voltage to a high voltage) of a strobe signal 134. Tri-state gate 136 is configured to transmit the charge count value stored in snapshot register 130 upon a transition (e.g., from a low voltage to a high voltage) of a row enable signal 138. Reset signal 132 may reset well capacitor 112 and accumulator 128 to an initial state.

FIG. 1 is an example illustration of a digital pixel 100 in which accumulator 128 may be used. Other embodiments may include other devices in addition to or in place of comparator 120 and/or capacitor reset logic 124 to implement the charge counting function of digital pixel 100. Furthermore, accumulator 128 may operate in conjunction with snapshot register 130 to implement an integrate-while-read mode or without snapshot register 130 to implement one or more different modes, such as an integrate-then-read mode or a rolling shutter mode.

Figure 2:
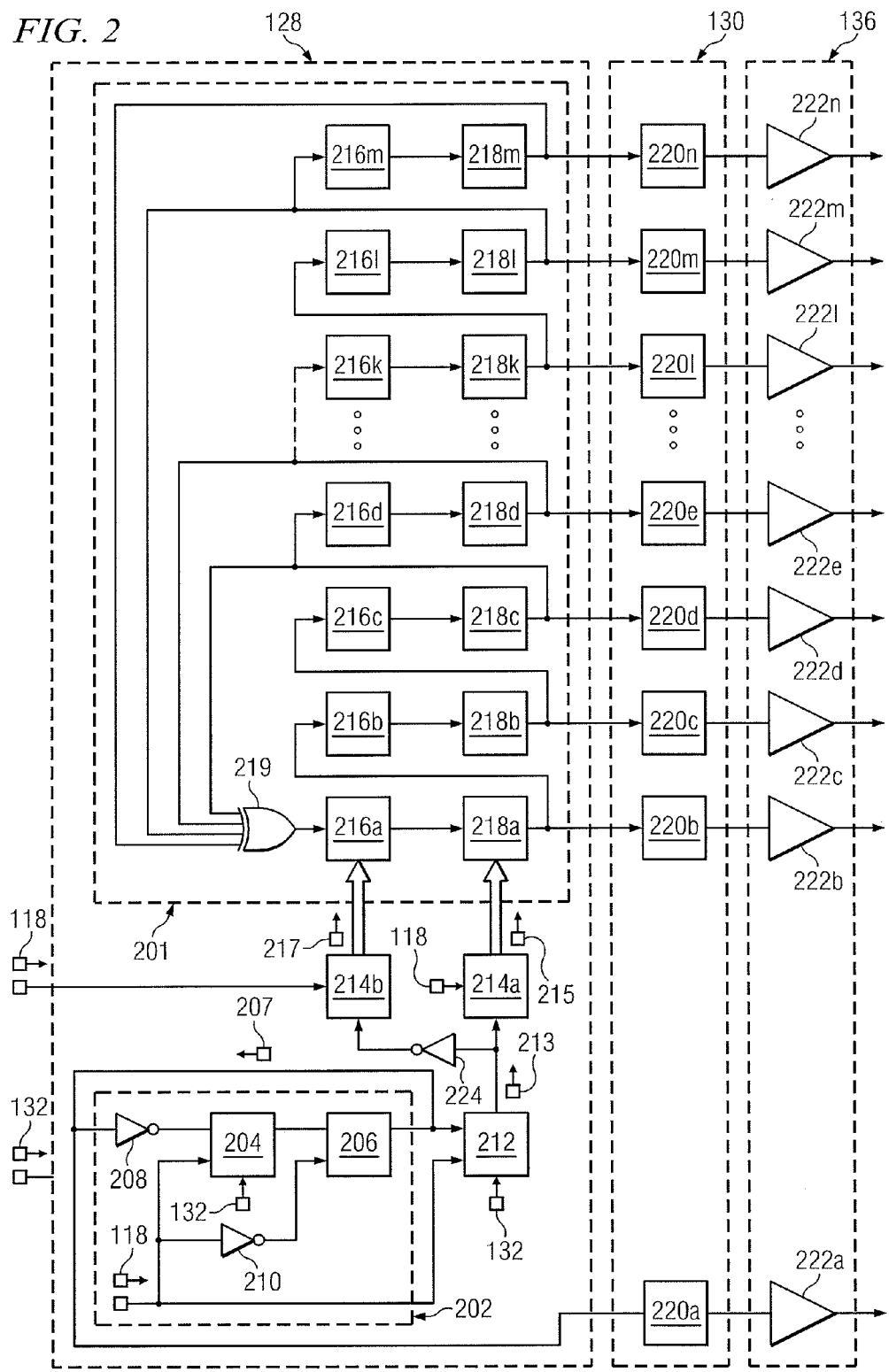
FIG. 2 depicts example embodiments of the accumulator, snapshot register, and tri-state gate of the digital pixel of FIG. 1.

FIG. 2 depicts example embodiments of the accumulator 128, snapshot register 130, and tri-state gate 136 of digital pixel 100. Accumulator 128 includes toggle flip flop 202, delay slave latch 212, inverter 224, clock generators 214, and a shift register 201 comprising a plurality of bits. Each bit of shift register 201 includes a master latch 216 and a slave latch 218 coupled together. Each slave latch 218 is coupled to a corresponding capture latch 220 of snapshot register 130 and each capture latch 220 is coupled to a corresponding tri-state driver 222 of tri-state gate 136. In the embodiment depicted, accumulator 128 is configured to store fourteen bits, with thirteen bits being stored by shift register 201 and one bit stored by toggle flip flop 202. In certain embodiments, toggle flip flop 202 stores the least significant bit of the accumulator circuit, because (as explained in further detail below) the value stored by toggle flip flop 202 changes state value each time capacitor reset signal 118 pulses.

Toggle flip flop 202 includes master latch 204, slave latch 206, and inverters 208 and 210. Toggle flip flop 202 is configured to receive capacitor reset signal 118 and generate an output value that toggles each time capacitor reset signal 118 transitions in a particular manner (e.g., upon each transition from high voltage to low voltage). In the embodiment depicted, master latch 204 is configured to latch the value of the output of inverter 208 upon a particular type of transition (e.g., from low voltage to high voltage) of capacitor reset signal 118. This value is then provided at the output of master latch 204 to slave latch 206. An inverted version of capacitor reset signal 118 is generated by inverter 210. In response to a particular type of transition of the inverted version of capacitor reset signal 118 (which may be the same type that latched data in master latch 204), slave latch 206 latches the value provided at the output of master latch 204. This value (toggle flop output signal 207) is then inverted through inverter 208, routed back to master latch 204, and latched by master latch 204 upon the next instance of the particular type of transition of capacitor reset signal 118. In this manner, toggle flip flop 202 is configured to generate an output that toggles once per pulse of capacitor reset signal 118. Since capacitor reset signal 118 will generally resemble a clock signal having a frequency that is based on the intensity of light received at digital pixel 100, the output of toggle flip flop 202 (i.e., toggle flop output signal 207) may resemble a clock signal having a frequency that is half the frequency of the capacitor reset signal 118. The output of toggle flip flop 202 is coupled to delay slave latch 212. Delay slave latch 212 may be configured to receive the output of toggle flip flop 202 and delay the output before it is received by the clock generators 214. For example, delay slave latch 212 may latch the value of toggle flop output signal 207 upon a falling edge of capacitor reset signal 118. The delay slave latch 212 operates to ensure that the clock signals 215 and 217 generated by clock generators 214a and 214b remain stable for the duration of their pulse widths. In an alternate embodiment, delay latch 212 may be omitted and the output of master latch 204 coupled to inverter 224 and clock generator 214a.

After passing through delay slave latch 212, the delayed output of the toggle flip flop 202 (i.e., toggle flop delayed signal 213) is received at clock generator 214a and inverted by inverter 224. The inverted toggle flop delayed signal 213 is then received at clock generator 214b. Clock generators 214 also receive capacitor reset signal 118. Clock generators 214 are configured to generate a respective clock signal 215 or 217 based on the capacitor reset signal 118 and the respective signal received from the toggle flip flop 202. In particular embodiments, clock signal 215 generated by clock generator 214a is non-overlapping with clock signal 217 generated by clock generator 214b. That is, clock signal 215 may rise and fall (or fall and rise) while clock signal 217 remains low (or high), and then clock signal 217 may rise and fall (or fall and rise) while clock signal 215 remains low (or high). In a particular embodiment, clock generator 214a performs a logical AND (or equivalent) between the capacitor reset signal 118 and the output of the toggle flip flop 202 (which in certain embodiments is delayed through delay slave latch 212) to generate clock signal 215; and clock generator 214b performs a logical AND (or equivalent) between the capacitor reset signal 118 and the inverted output from the toggle flip flop 202 to generate clock signal 217.

The combination of clock signals 215 and 217 creates a two-phase non-overlapping clock capability. One phase provided by clock signal 217 is received by each master latch 216 of shift register 201 and the other phase provided by clock signal 215 is received by each slave latch 218 of the shift register. Clock signal 217 is used to latch data at master latches 216 of shift register 201 and clock signal 215 is used to latch data at slave latches 218 of the shift register. For example, each master latch 216 may latch the data at its input upon a particular type of transition (e.g., from low voltage to high voltage) by clock signal 217 and each slave latch 218 may latch the data at its input upon the same particular type of transition by clock signal 215.

In typical systems, a master and slave latch pair of a shift register are coupled to the same clock and may suffer from hold time violations if the signal from the master latch to the slave latch is not delayed by an inverter or other delay element. For example, if all master and slave latches of a shift register respond to the same clock edges, the latches may be susceptible to hold time violations, depending on the manufacturing variation, noise duress, voltage, temperature, or process skew associated with the latches. Similarly, hold time violations may occur between the slave of a shifter register latch and the corresponding next master latch. While hold time issues may be mitigated by placing one or more inverters or other delay elements in between each master latch and slave latch, this requires more area and thus results in a reduction of the number of bits in the shift register for a given process node or the use of a more advanced and expensive process node.

Certain embodiments of the present disclosure utilizing the two-phase clocking arrangement described above enable the master and slave latch pairs of shift register 201 to function without an inverter or other delay component placed between each master and slave latch. The two-phase non-overlapping clock system may provide hold time immunity for the master latches 216 and the slave latches 218 of shift register 201. Accord, certain embodiments reduce the size of a shift register and thus may improve the density of digital pixel layout. Such improvement in density can be used to create in-digital pixel digital circuits comprising fully static logic. Certain embodiments could also be applied to other circuit types, including dynamic register implementations, for further density advantages. Utilization of the two-phase non-overlapping clock signals 215 and 217 may also allow the power consumption of the shift register to be cut by approximately fifty percent, since only one set of latches (i.e., either the master latches 216 or the slave latches 218) respond to a clock pulse rather than both sets of latches responding to each clock pulse.

In the embodiment depicted, shift register 201 is a thirteen-bit LFSR. Each master latch 216 of the LFSR is configured to receive clock signal 217 and each slave latch of the LFSR is configured to receive clock signal 215. Each master latch 216 may latch its input upon on a rising (or falling) edge of clock signal 217 and each slave latch 218 may latch its input (which may be the output of its paired master latch 216) upon a rising (or falling) edge of the clock signal 215. Various taps are placed at the outputs of particular slave latches 218 and these outputs are coupled to an exclusive or (XOR) gate 219. The output of the XOR gate 219 is then provided at the input of the master latch 216a of the least significant bit of the LFSR. The LFSR is operable to count by proceeding through a pseudo-random sequence as it is clocked by clock signals 217 and 215. In some embodiments, an LFSR look-up table may be provided by a device that includes the LFSR in order to convert LFSR count values back into binary values. Some embodiments include static CMOS logic and/or dynamic logic.

In various embodiments, the combination of XOR gate 219 and the specific "taps" (bit outputs) from shift register 201 create a maximal length sequence. Specifically, they allow the shift register 201 to count to $2^N-1$ (where N is the number of LFSR bits) possible states without repeating a vector value. In various embodiments, the size (i.e., number of bits) of the LFSR may vary and there may be a plurality of maximal length sequence tap patterns for any given length. Shift register 201 of accumulator 128 has a range of $2^{13}-1=8191$ counts and toggle flip flop 202 has a range of 2 counts. Thus, accumulator 128 has an aggregate range of $(2^{13}-1)*2=16382$ counts. In general, accumulator 128 may have $2*(2^N-1)$ counts. Thus, as illustrated above, toggle flip flop 202 may comprise a portion of the accumulator count.

Although certain embodiments of the present disclosure are described herein using an LFSR as an example, the two-phase clocking system may be used with any suitable type of shift register to save area and power consumption. By way of example and not limitation, accumulator 128 may include a binary counter or a gray code counter in place of the illustrated shift register 201.

In a particular embodiment that implements integrate-while-read snapshot capability, each of slave latch 206 of toggle flip flop and slave latches 218 of shift register 201 are coupled to a corresponding capture latch 220 of snapshot register 130. Each capture latch 220 is configured to respond to a capture event (e.g., a transition of a capture signal) by capturing the value at the input of the capture latch 220 (i.e., the value of the corresponding bit of shift register 201 or toggle flip flop 202) and storing that value until a new capture event is detected. Each capture latch 220 is also coupled to a corresponding tri-state driver 222 of tri-state gate 136. A tri-state driver 222 may allow an output of a corresponding capture latch 220 to be enabled at a desired time (e.g., when it is read out). As an example, a bit of accumulator 128 may share an output line with bits from other digital pixels. A tri-state driver 222 may allow one bit to be read while the other bits present a high impedance state to the line. For example, when a particular tri-state gate 136 is enabled (i.e., each tri-state driver 222 of the tri-state gate 136 is enabled) the corresponding set of N bits of accumulator 128 is asserted and when it is not enabled each tri-state driver 222 presents a high impedance state in order to allow a different tri-state gate to assert its set of N bits at an output. In particular embodiments, snapshot register 130 may be omitted and tri-state gates 136 coupled directly to slave latches 218. As described above, any suitable method of reading out the value of shift register 201 may be used.

The accumulator 128 may be configured to assume a default state in response to the assumption of a reset state by reset signal 132. The reset state may be any suitable state, such as a logical "1" or logical "0." Resetting accumulator 128 may include resetting a latch of toggle flip flop 202 and at least one of the master latch 216 or slave latch 218 of every bit of shift register 201. Upon a reset, the thirteen-bit LFSR of shift register 201 may transition to a value of 0000000000001, where the least significant bit (i.e., the bit implemented by master latch 216a and slave latch 218a) is reset to a logical "1" and every other bit is reset to a logical "0." In particular embodiments, an LFSR may be reset to any value as long as at least one bit of the LFSR has a logical value of "1." In some embodiments, an additional bit of an LFSR may be allocated to allow an effective all-zero reset condition. Furthermore, other embodiments may utilize the complimentary conditions of the LFSR (e.g., substituting 0's for 1's, 1's for 0's, and using alternate XOR gates). In other counter forms such as binary or gray, the requirement of at least one bit set to non-zero may not be needed.

Figure 3:
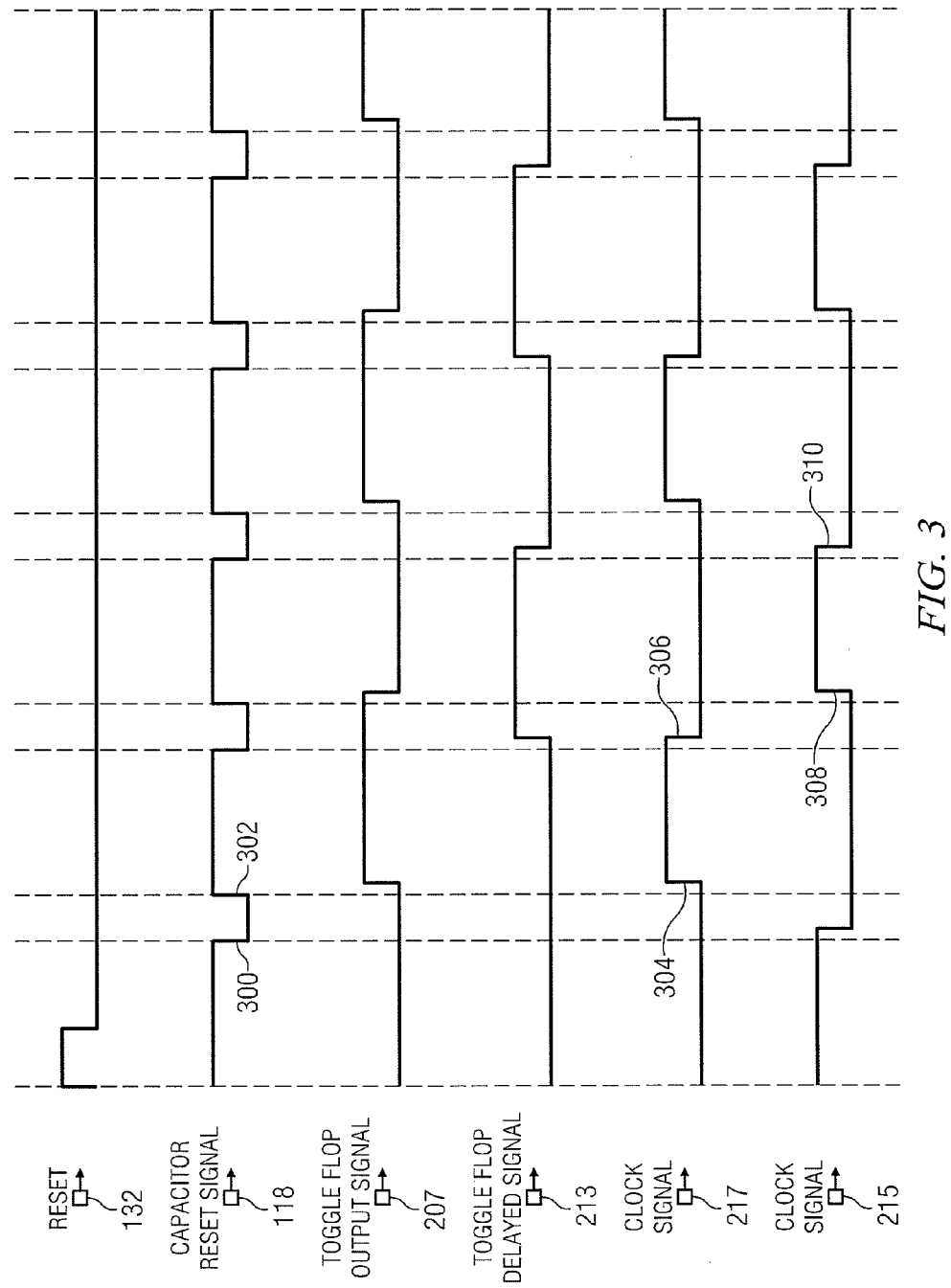
FIG. 3 depicts example waveforms of signals generated by the accumulator of FIG. 2.

FIG. 3 depicts example waveforms of signals generated by accumulator 128. Reset signal 132 is pulsed once and then maintains a logical value of "0" for the remainder of the waveform timeline. In particular embodiments, reset signal 132 is asserted at the beginning of a frame period. Capacitor reset signal 118 has a logical value of "1" except for periodic pulses that each have a falling edge 300 and a rising edge 302. These pulses may be generated in response to a charge stored in well capacitor 112 crossing a particular threshold. Toggle flop output signal 207 begins in a low state due to being reset by reset signal 132. Toggle flop output signal 207 toggles value in response to each rising edge of capacitor reset signal 118 (after a slight propagation delay). The value of toggle flop delayed signal 213 tracks the value of the toggle flop output signal 207 upon the falling edge of capacitor reset signal 118. The inverse of the toggle flop output signal 207 is inverted and sent to clock generator 214b. Clock generator 214b performs a logical AND on the inverse of the toggle flop delayed signal 213 and the capacitor reset signal 118. The result is clock signal 217 which is high when capacitor reset signal 118 is high and toggle flop delayed signal 213 is low. Clock generator 214b performs a logical AND on the toggle flop delayed signal 213 and the capacitor reset signal 118. The result is clock signal 215 which is high when capacitor reset signal 118 is high and toggle flop delayed signal 213 is high. Clock signals 215 and 217 have two non-overlapping phases. As depicted, clock signal 217 has a rising edge 304 and a falling edge 306 while clock signal 215 remains low and clock signal 215 has a rising edge 308 and a falling edge 310 while clock signal 217 remains low. As described above, this non-overlapping two-phase clocking arrangement may be used to clock the master and slave latches of a shift register. Utilizing toggle flop delayed signal 213 to create non-overlapping clock signals 217 and 215 may reduce or eliminate glitches. Any other suitable delay mechanism may be used.

Figure 4:
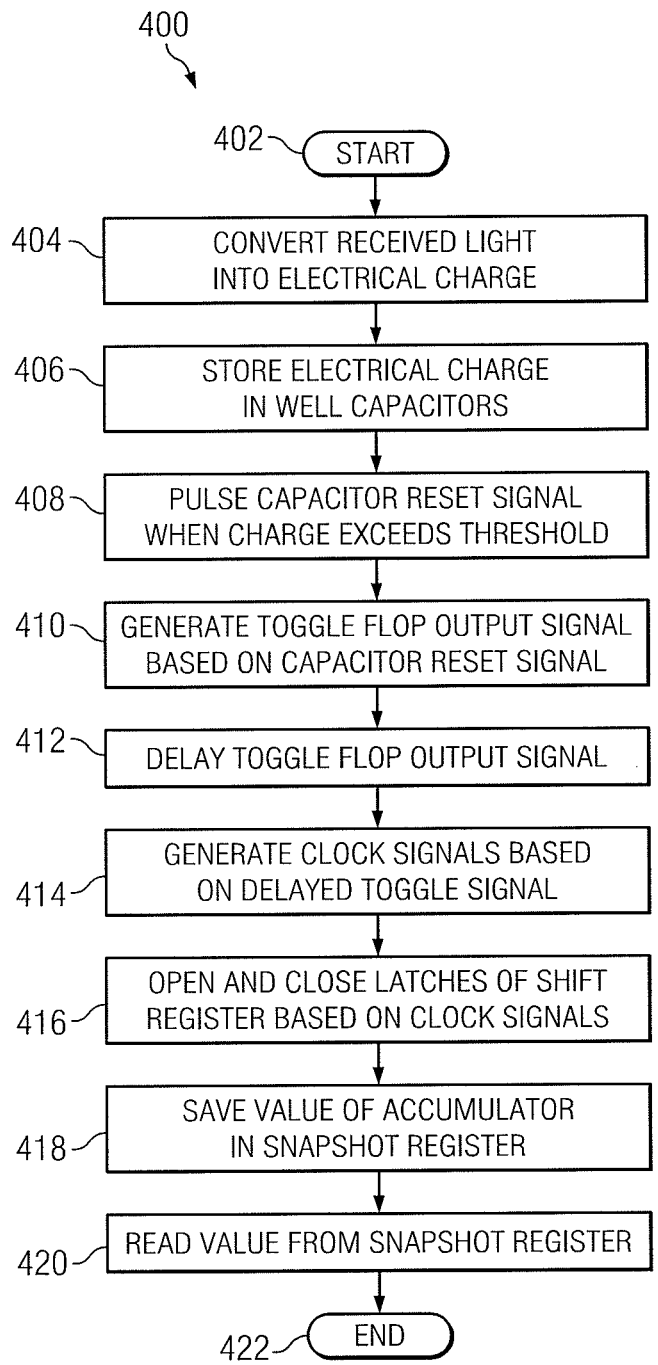
FIG. 4 depicts an example method for operating the digital pixel of FIG. 1.

FIG. 4 depicts an example method 400 for operating digital pixel 100. The method begins at step 402. At step 404, digital pixel 100 receives light and converts the light into electrical charge. For example, photo-diode 110 of digital pixel 100 may be operable to convert the light it receives into photo-current. Direct injection gate 114 may bias photo-diode 110 such that a quantity of current may flow from voltage source 116 to well capacitor 112 according to the amount of light received by photo-diode 110.

At step 406, the generated electrical charge is stored in well capacitor 112. At step 408, a capacitor reset signal 118 is pulsed when the charge of well capacitor 112 crosses a threshold value. Comparator 120 or other similar device is operable to detect whether the amount of charge held by well capacitor 112 crosses a threshold value. For example, comparator 120 may compare the voltage across well capacitor 112 with a reference voltage 122 and transition capacitor reset signal 118 when the well capacitor's voltage crosses (e.g., exceeds) the reference voltage. Such an event may indicate that the well capacitor 112 is at a target voltage. Capacitor reset logic 124 is operable to generate an appropriate reset signal 121 in response to detecting the transition of capacitor reset signal 118. Reset signal 121 may be used to reset well capacitor 112 to a reference voltage 126. For example, reset signal 121 may be used to close switch 127, allowing charge stored in well capacitor 112 to dissipate. Capacitor reset signal 118 will then transition to a default logical value.

The number of pulses by capacitor reset signal 118 may be tracked (e.g., counted) in order to determine an amount of charge collected by well capacitor 112 during a time period, such as a frame. If the photo-current generated by photo-diode 110 is relatively high (representing a brighter portion of a scene), then more pulses of capacitor reset signal 118 will be generated. Conversely, if the photo-current is relatively low (representing a darker portion of a scene), less pulses of capacitor reset signal 118 will be generated.

At step 410, toggle flop output signal 207 is generated based on the capacitor reset signal 118. The toggle flop output signal 207 may toggle once per pulse of the capacitor reset signal 118. Accordingly, toggle flop output signal 207 may resemble a clock signal with a frequency of one half the frequency of the capacitor reset signal 118. Toggle flop output signal 207 may also represent the value of the least significant bit of the charge count value that tracks the number of pulses of capacitor reset signal 118. At step 412, the toggle flop output signal 207 is delayed. In a particular embodiment, a slave latch is used to delay the toggle flop output signal 207 to produce a toggle flop delayed signal 213. The slave latch may latch the data of the toggle flop output signal 207 on a different edge of capacitor reset signal 118 than the edge used to change the value of toggle flop output signal 207.

At step 414, clock signals 215 and 217 are generated based on the toggle flop delayed signal 213. The clock signals 215 and 217 collectively provide a two-phase non-overlapping clocking capability. In particular embodiments, clock signals 215 and 217 are generated by performing a logical AND on capacitor reset signal 118 and toggle flop delayed signal 213 (or an inverted version of this signal). At step 416, latches 216 and 218 of a shift register are opened and closed based on clock signals 215 and 217. As an example, master latches 216 may each open to accept data when clock signal 217 is low and close (i.e., latch) when clock signal 217 goes high. As another example, slave latches 218 may each open to accept data when clock signal 215 is low and close when clock signal 215 goes high. The shift register that includes the master latches 216 may be a counter that stores at least a portion of a charge count value tracking the number of capacitor reset signal 118 pulses.

At step 418, the charge count value stored in accumulator 128 is saved in snapshot register 130. For example, when a snapshot event occurs at the end of a frame period, the contents of the accumulator 128 may be copied into the snapshot register 130. The snapshot event may occur at any suitable time and generally occurs once per frame. In conjunction with the snapshot event, reset signal 132 may be sent to reset the capacitor reset logic 124 and/or accumulator 128. In other embodiments, no reset signal is sent to accumulator 128 and the difference between successive snapshot register values indicates the amount of light received by the digital pixel 100 during the relevant time period. At step 420, the value of the snapshot register 130 is read out through tri-state gate 136. The snapshot register 130 may be read while the digital pixel 100 continues to accumulate charge at well capacitor 112. The value may be used in conjunction with the values of other snapshot registers of other digital pixels of the FPA to construct an image. The method ends at step 422.

Modifications, additions, or omissions may be made to the systems, apparatuses, and methods disclosed herein without departing from the scope of the disclosure. The components of the systems may be integrated or separated. Moreover, the operations of the systems may be performed by more, fewer, or other components. The methods may include more, fewer, or other steps. Additionally, steps may be performed in any suitable order and/or multiple steps may be performed simultaneously.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A digital pixel comprising:
   one or more capacitors configured to collect charge corresponding to an amount of light received at the digital pixel;
   a threshold detector configured to generate a first signal that transitions logically based on an amount of charge in the one or more capacitors; and
   an N bit accumulator configured to store a value that indicates a count of a particular type of logical transition of the first signal, the N bit accumulator including:
   a toggle flip flop configured to receive the first signal and generate a second signal having a logical value that toggles in response to the particular type of logical transition of the first signal;
   a first clock generator configured to generate a first clock signal by performing a logical AND of the first signal and the second signal;
   a second clock generator configured to generate a second clock signal by performing a logical AND of the first signal and an inverted version of the second signal; and
   a linear feedback shift register (LFSR) comprising N−1 bits, each bit of the LFSR comprising a master latch and a slave latch, each master latch of the N−1 bits configured to latch a value received at the input of the master latch in response to a particular type of logical transition of the first clock signal, each slave latch of the plurality of bits configured to latch an output value of the master latch of the respective bit in response to a particular type of logical transition of the second clock signal.

2. The digital pixel of claim 1, wherein the first clock signal generated by the first clock generator is configured to transition from a first logical state to a second logical state and back to the first logical state while the second clock signal maintains a constant logical state.

3. The digital pixel of claim 1, wherein the toggle flip flop stores a least significant bit of the N bit accumulator.

4. The digital pixel of claim 1, further comprising a delay latch coupled between the output of the toggle flip flop and the first and second clock generators.

5. The digital pixel of claim 1, further comprising:
   a plurality of capture latches, each capture latch of the plurality of capture latches coupled to a respective bit of the plurality of bits; and
   a plurality of tri-state drivers, each tri-state driver of the plurality of tri-state drivers coupled to a respective capture latch of the plurality of capture latches.

6. An apparatus comprising:
   a toggle flip flop configured to receive a first signal and generate a second signal having a logical value that toggles in response to a particular type of logical transition of the first signal;
   a first clock generator configured to generate a first clock signal by performing a logical AND of the first signal and the second signal;
   a second clock generator configured to generate a second clock signal by performing a logical AND of the first signal and an inverted version of the second signal; and
   a shift register comprising a plurality of bits, each bit comprising a master latch and a slave latch, each master latch of the plurality of bits configured to latch a value received at the input of the master latch in response to a particular type of logical transition of the first clock signal, each slave latch of the plurality of bits configured to latch an output value of the master latch of the respective bit in response to a particular type of logical transition of the second clock signal.

7. The apparatus of claim 6, wherein the first clock signal generated by the first clock generator is configured to transition from a first logical state to a second logical state and back to the first logical state while the second clock signal maintains a constant logical state.

8. The apparatus of claim 6, further comprising an exclusive or (XOR) gate coupled to two or more of the slave latches of the plurality of bits, the output of the XOR gate coupled to the input of a master latch of the plurality of master latches of the shift register.

9. The apparatus of claim 6, wherein the plurality of bits and the toggle flip flop store a count of the occurrences of the particular type of logical transition of the first signal.

10. The apparatus of claim 6, further comprising a delay latch coupled between the output of the toggle flip flop and the first and second clock generators.

11. The apparatus of claim 6, further comprising:
a plurality of capture latches, each capture latch of the plurality of capture latches coupled to a respective bit of the plurality of bits; and
a plurality of tri-state drivers, each tri-state driver of the plurality of tri-state drivers coupled to a respective capture latch of the plurality of capture latches.

12. A method comprising:
generating a first clock signal and a second clock signal, the first clock signal configured to transition from a first logical state to a second logical state and back to the first logical state during a first time period that the second clock signal does not transition logical states, the second clock signal configured to transition from a third logical state to a fourth logical state and back to the third logical state during a second time period that the first clock signal does not transition logical states;
latching, by a plurality of master latches of a shift register, a plurality of values at a plurality of inputs of the master latches in response to a particular type of logical transition of the first clock signal;
latching, by a plurality of slave latches of the shift register, a plurality of output values of the plurality of master latches at a plurality of inputs of the slave latches in response to a particular type of logical transition of the second clock signal;
generating, by a toggle flip flop, a first signal that toggles in response to a particular type of logical transition of a second signal;
performing a logical AND of the first signal and the second signal to generate the first clock signal; and
performing a logical AND of an inverted version of the first signal and the second signal to generate the second clock signal.

13. The method of claim 12, wherein the first and third logical states are equivalent logical states and the second and fourth logical states are equivalent logical states.

14. The method of claim 12, further comprising storing a count of occurrences of the particular type of logical transition of the second signal in the shift register and the toggle flip flop.

15. The method of claim 12, further comprising delaying the first signal through a delay latch coupled to the output of the toggle flip flop.

16. The method of claim 14, further comprising sending the count of occurrences of the particular type of logical transition of the second signal to a plurality of capture latches and storing a second count of occurrences of the particular type of logical transition of the second signal in the shift register and the toggle flip flop.

* * * * *